(12) United States Patent
Sherstinsky et al.

(10) Patent No.: US 6,464,795 B1
(45) Date of Patent: Oct. 15, 2002

(54) SUBSTRATE SUPPORT MEMBER FOR A PROCESSING CHAMBER

(75) Inventors: Semyon Sherstinsky, San Francisco; Calvin Augason, Los Altos; Leonel A. Zuniga, San Jose; Jun Zhao, Cupertino; Talex Sajoto, Campbell; Leonid Selyutin, San Leandro; Joseph Yudovsky, Campbell; Maitreyee Mahajani, San Jose; Steve G. Ghanayem, Sunnyvale; Tai T. Ngo, Dublin; Arnold Kholodenko, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/563,573

(22) Filed: May 3, 2000

Related U.S. Application Data

(60) Provisional application No. 60/135,293, filed on May 21, 1999.

(51) Int. Cl.[7] ............................................. G23C 16/00
(52) U.S. Cl. ...................... 118/728; 118/715; 118/725
(58) Field of Search .............................. 269/21, 289 R; 118/728, 725, 500

(56) References Cited

U.S. PATENT DOCUMENTS

| | | | |
|---|---|---|---|
| 3,355,078 A | 11/1967 | Smith | 228/44 |
| 3,955,163 A | 5/1976 | Novak | 355/132 |
| RE31,053 E | 10/1982 | Firtion et al. | 355/77 |
| 4,458,746 A | 7/1984 | Holden et al. | 165/80 A |
| 4,473,455 A | 9/1984 | Dean et al. | 204/298 |
| 4,603,466 A | * 8/1986 | Morley | 29/569 R |
| 4,707,012 A | 11/1987 | Takagi | 294/64.1 |
| 4,853,102 A | 8/1989 | Tateishi et al. | 204/298 |
| 4,860,687 A | 8/1989 | Frijlink | 118/500 |
| 4,951,601 A | 8/1990 | Maydan et al. | 118/719 |

(List continued on next page.)

FOREIGN PATENT DOCUMENTS

| | | | |
|---|---|---|---|
| EP | 0 343 502 A3 | 11/1989 | H01L/21/00 |
| EP | 343 502 A2 | 11/1989 | H01L/21/00 |
| EP | 0 456 426 A1 | 11/1991 | H01L/21/00 |
| EP | 489 439 A1 | 6/1992 | C23C/16/44 |
| EP | 595 307 A2 | 5/1994 | H01L/21/00 |
| EP | 598 362 A1 | 5/1994 | C23C/14/50 |
| EP | 650 181 A2 | 4/1995 | H01J/37/20 |
| WO | WO 95/04373 | 2/1995 | |

OTHER PUBLICATIONS

U.S. application Ser. No. 09/026,575, Inagawa et al., "Shadow Frame From Substrate Processing," filed Apr. 27, 2000.
Abstract of Japanese Patent Application 04–074,412A, dated Mar. 9, 1992.
Abstract of Japanese Patent Application 10–242,255, dated Sep. 11, 1998.

*Primary Examiner*—Gregory Mills
*Assistant Examiner*—Karla Moore
(74) *Attorney, Agent, or Firm*—Moser Patterson Sheridan LLP

(57) ABSTRACT

A support member for supporting a substrate in a process chamber, the support member having a substrate support surface with one or more isolated recessed areas. A vacuum channel and a gas channel are formed in the support member along a common plane and are coupled to a vacuum source and gas source respectively. The gas channel comprises two or more concentrically disposed annular gas channels encompassing the vacuum channel. The vacuum channel is coupled to the support surface, and in particular to the one or more recessed areas, by a plurality of conduits. A portion of the conduits is disposed diametrically exterior to at least one of the annular gas channels and communicates with the vacuum channel via bypass channels.

28 Claims, 7 Drawing Sheets

U.S. PATENT DOCUMENTS

| | | | | |
|---|---|---|---|---|
| 4,978,412 | A | 12/1990 | Aoki et al. | 156/345 |
| 5,033,538 | A * | 7/1991 | Wagner et al. | 165/80.1 |
| 5,119,761 | A | 6/1992 | Nakata | 118/725 |
| 5,133,284 | A * | 7/1992 | Thomas et al. | 118/719 |
| 5,177,878 | A * | 1/1993 | Visser | 34/92 |
| 5,180,000 | A * | 1/1993 | Wagner | 165/80.1 |
| 5,226,383 | A | 7/1993 | Bhat | 118/730 |
| 5,228,501 | A | 7/1993 | Tepman et al. | 165/80.1 |
| 5,230,741 | A * | 7/1993 | van de Ven et al. | 118/728 |
| 5,238,499 | A | 8/1993 | Van de Ven et al. | 118/724 |
| 5,262,029 | A | 11/1993 | Erskine et al. | 204/298.15 |
| 5,267,607 | A | 12/1993 | Wada | 165/80.1 |
| 5,292,399 | A | 3/1994 | Lee et al. | 156/643 |
| 5,292,554 | A | 3/1994 | Sinha et al. | 427/251 |
| 5,304,248 | A | 4/1994 | Cheng et al. | 118/728 |
| 5,316,278 | A | 5/1994 | Sherstinsky et al. | 269/254 R |
| 5,316,645 | A | 5/1994 | Yamagami et al. | 204/298.06 |
| 5,326,725 | A | 7/1994 | Sherstinsky et al. | 437/225 |
| 5,328,722 | A | 7/1994 | Ghanayem et al. | 427/250 |
| 5,343,938 | A | 9/1994 | Schmidt | 165/80.2 |
| 5,352,294 | A | 10/1994 | White et al. | 118/725 |
| 5,374,829 | A | 12/1994 | Sakamoto et al. | 250/453.11 |
| 5,376,180 | A | 12/1994 | Mahler | 118/728 |
| 5,383,971 | A | 1/1995 | Selbrede | 118/728 |
| 5,403,459 | A | 4/1995 | Guo | 204/192.32 |
| 5,421,401 | A | 6/1995 | Sherstinsky et al. | 165/80.2 |
| 5,437,752 | A | 8/1995 | Lang | 156/210 |
| 5,439,524 | A | 8/1995 | Cain et al. | 118/723 |
| 5,447,570 | A | 9/1995 | Schmitz et al. | 118/728 |
| 5,456,756 | A | 10/1995 | Ramaswami et al. | 118/721 |
| 5,460,703 | A | 10/1995 | Nulman et al. | 204/192.12 |
| 5,468,299 | A | 11/1995 | Tsai | 118/730 |
| 5,474,612 | A | 12/1995 | Sato et al. | 118/725 |
| 5,476,548 | A | 12/1995 | Lei et al. | 118/728 |
| 5,516,367 | A | 5/1996 | Lei et al. | 118/725 |
| 5,518,593 | A | 5/1996 | Hosokawa et al. | 204/192.12 |
| 5,534,072 | A | 7/1996 | Mizuno et al. | 118/728 |
| 5,534,110 | A | 7/1996 | Lenz et al. | 156/643.1 |
| 5,540,821 | A | 7/1996 | Tepman | 204/192.13 |
| 5,556,476 | A | 9/1996 | Lei et al. | 118/728 |
| 5,558,721 | A | 9/1996 | Kohmura et al. | 118/730 |
| 5,574,247 | A | 11/1996 | Nishitani et al. | 118/708 |
| 5,611,865 | A | 3/1997 | White et al. | 118/725 |
| 5,632,873 | A | 5/1997 | Stevens et al. | 204/298.15 |
| 5,643,366 | A * | 7/1997 | Somekh et al. | 118/721 |
| 5,665,167 | A | 9/1997 | Deguchi et al. | 118/728 |
| 5,703,493 | A | 12/1997 | Weeks et al. | 324/755 |
| 5,716,486 | A | 2/1998 | Selwyn et al. | 156/345 |
| 5,725,718 | A | 3/1998 | Banholzer et al. | 156/345 |
| 5,728,276 | A | 3/1998 | Katsuki et al. | 204/298.11 |
| 5,738,165 | A | 4/1998 | Imai | 165/80.2 |
| 5,738,751 | A * | 4/1998 | Camerson | 156/345 |
| 5,749,999 | A | 5/1998 | Dandia | 156/285 |
| 5,753,133 | A | 5/1998 | Wong et al. | 216/67 |
| 5,766,365 | A | 6/1998 | Umotoy et al. | 118/728 |
| 5,810,931 | A | 9/1998 | Stevens et al. | 118/721 |
| 5,827,408 | A | 10/1998 | Raaijmakers | 204/192.12 |
| 5,843,233 | A * | 12/1998 | van de Ven et al. | 118/715 |
| 5,851,299 | A | 12/1998 | Cheng et al. | 118/729 |
| 5,860,640 | A | 1/1999 | Marohl et al. | 269/289 R |
| 5,882,417 | A * | 3/1999 | van de Ven et al. | 118/728 |
| 5,882,419 | A | 3/1999 | Sinha et al. | 118/729 |
| 5,888,304 | A | 3/1999 | Umotoy et al. | 118/720 |
| 5,961,774 | A | 10/1999 | Tamura et al. | 156/345 |
| 5,985,033 | A | 11/1999 | Yudovsky et al. | 118/715 |
| 6,040,011 | A | 3/2000 | Yudovsky et al. | 427/255.28 |
| 6,138,745 | A * | 10/2000 | Moleshi | 165/80.1 |
| 6,203,622 | B1 * | 3/2001 | Halpin et al. | 118/730 |
| 6,206,973 | B1 * | 3/2001 | Bailey et al. | 118/718 |

* cited by examiner

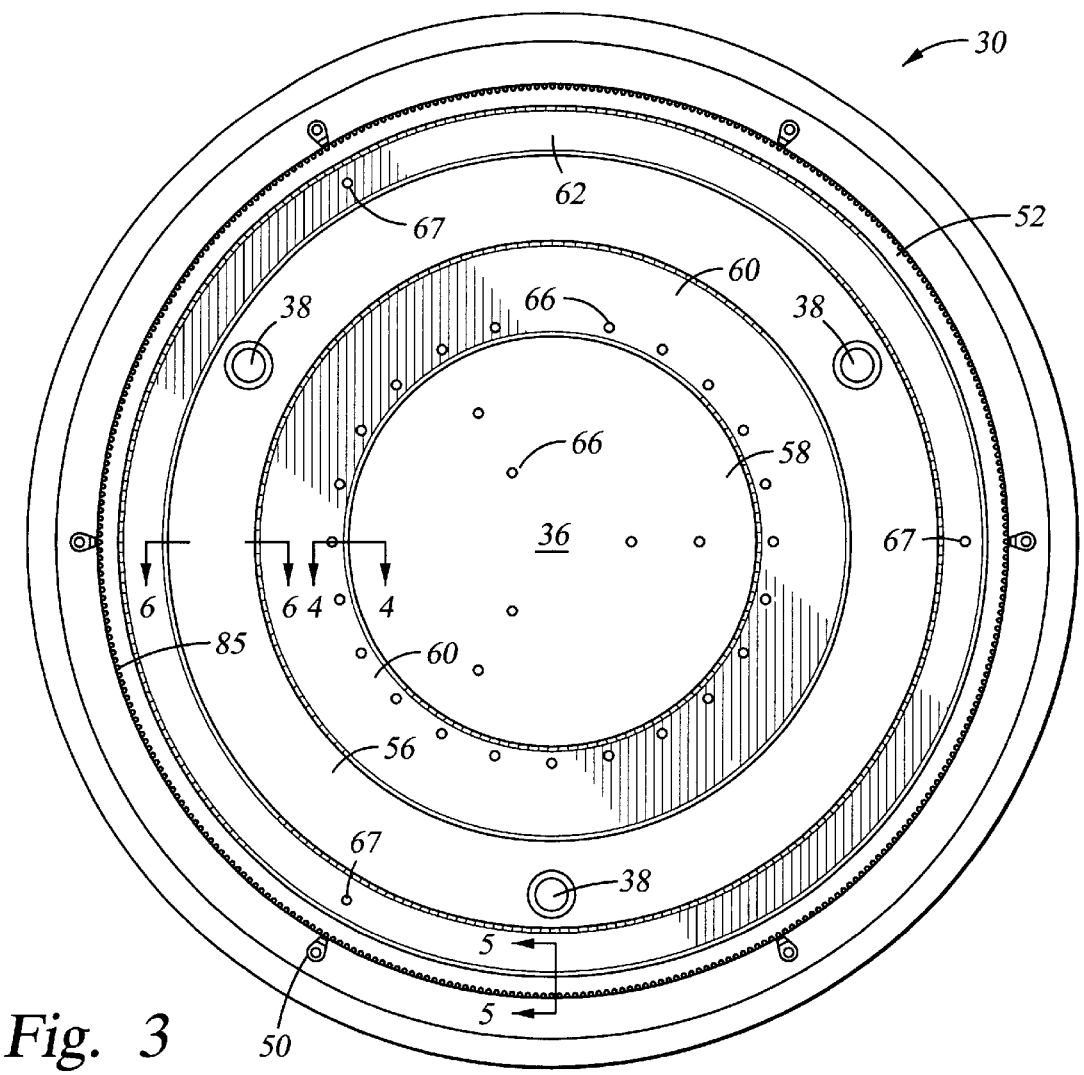
Fig. 3
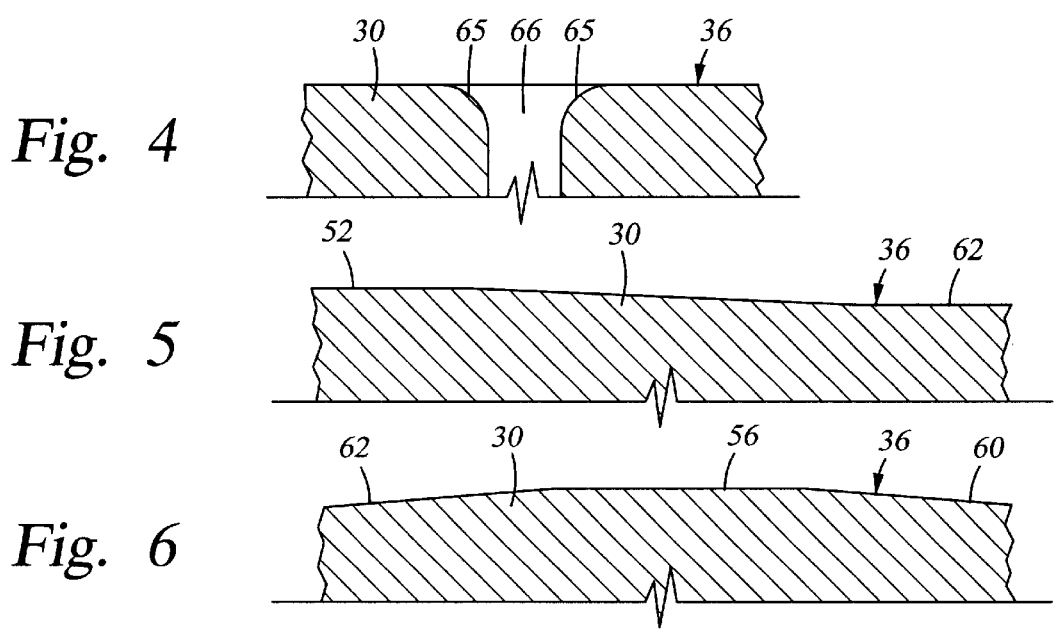
Fig. 4
Fig. 5
Fig. 6

US 6,464,795 B1

SUBSTRATE SUPPORT MEMBER FOR A PROCESSING CHAMBER

This application claims benefit of provisional application No. 60/135,293 filed May 21, 1999.

BACKGROUND OF THE INVENTION

1. Field of the Invention

The present invention relates to the field of semiconductor substrate processing equipment. More particularly, the present invention relates to an improved support member adapted for vacuum chucking of a substrate thereto and delivering a purge gas to the edge of a substrate supported thereon.

2. Background of the Related Art

In the fabrication of integrated circuits, equipment has been developed to automate substrate processing by performing a sequence of processing steps on a substrate without removing the substrate from a vacuum environment, thereby reducing transfer times and contamination of substrates. Such a vacuum system has been disclosed, for example, by Maydan et al. in U.S. Pat. No. 4,951,601, in which a plurality of processing chambers are connected to a central transfer chamber. A robot disposed in the central transfer chamber passes substrates through slit valve openings formed in the various connected processing chambers and retrieves the substrates after processing in the chambers is complete.

The processing steps carried out in the vacuum chambers typically require the deposition or etching of multiple metal, dielectric and semiconductive film layers on the surface of a substrate. Examples of such processes include chemical vapor deposition (CVD), physical vapor deposition (PVD), and etching processes. Although the present application primarily discusses CVD process chambers and systems, the present invention is equally applicable to other process chambers and systems.

CVD vacuum chambers are employed to deposit thin films on semiconductor substrates. Typically, a precursor gas is charged into a vacuum chamber through a gas manifold plate situated above the substrate, and the substrate is heated to process temperatures generally in the range of about 250° C. to about 650° C. The precursor gas reacts on the heated substrate surface to deposit a thin layer thereon.

In a typical process chamber, a support member, commonly formed of aluminum, ceramic, or other material, on which a substrate is mounted during processing is vertically movable in the chamber. A plurality of support fingers are also vertically movable by an elevator and extend through the support member to facilitate transfer of a substrate from a robot blade to the support member. Typically, the support member also acts as a heater plate that is heated by a resistive heating element located therein which provides sufficient heat to maintain the substrate at a desired process temperature. Further, a purge gas is delivered to a perimeter of the substrate to prevent deposition gases from contacting and depositing on the edge and backside of the substrate.

Substrate uniformity is dependent on uniform heating and uniform purge gas delivery, among other things. Various known methods and support member designs are employed in the prior art to ensure such uniformity. For example, to increase the heat transfer from the support member to the substrate, the substrate is typically adhered to the upper surface of the support member by a "vacuum chuck." Typically, vacuum chucking is accomplished by applying a pressure differential between grooves formed in the upper surface of the support member and the process chamber. As shown in FIG. 1, the upper surface 12 of the support member 10 of a prior system includes a plurality of concentric grooves 14 formed therein which intersect a plurality of radial grooves 16. A vacuum supply communicates with the grooves 14, 16 through holes 18 disposed along the plurality of radial grooves 16 to supply a vacuum thereto. The plurality of radial grooves 16 extend to a diameter slightly less than the diameter of a substrate. Thus, the vacuum supply is able to create a low pressure environment under the substrate to chuck, or adhere, the substrate to the upper surface 12. Pulling the substrate tightly against the upper surface 12 of the support member 10 enhances the surface to surface contact and, therefore, the heat transfer therebetween.

The purge gas channels 20 of the support member 10 are shown in FIG. 1 by hidden lines 21. The gas channels 20 comprise a complicated labyrinth of interconnected passageways constructed by drilling from the edge of the support member 10 inward. The gas channels 20 lead to a plurality of holes 22 disposed around the perimeter of the upper surface of the support member 10 which provide outlets for a purge gas delivered to the substrate edge. The gas is delivered from a gas source (not shown) to the gas channels 20 though a gas delivery channel formed in a shaft (also not shown) of the support member 10.

One problem associated with current systems occurs as a result of cleaning the process chamber. During the deposition process, material such as tungsten, is deposited not only on the substrate, but also onto all of the hot chamber and support member components. Because the adhesion of the deposited material to the chamber and the support member is poor, the material tends to flake off over time creating particles within the system that can damage the chamber, the substrates, and the product. As a result, the deposited material must be removed periodically to avoid particle generation and contamination of substrates. The removal of the material is typically accomplished utilizing a low power fluorine containing plasma. In the case of tungsten, $NF_3$ is typically the cleaning gas of choice. The fluorine radicals of the low power $NF_3$ plasma attack the deposited tungsten during cleaning. However, the fluorine radicals also react with the aluminum of the support member to create an aluminum fluoride layer on the heater surface. Typically, this layer of aluminum fluoride is only about 0.0004 to about 0.0006 inches in thickness and does not create any detrimental effects as long as the thickness of the material is uniform. However, the grooves 14, 16 shown in FIG. 1 generally have a rectangular cross sectional shape which forms square corners at the intersection of the grooves 14, 16. Empirical studies have shown that the aluminum fluoride has greater accumulation at the intersections of the grooves of support members. This added accumulation of aluminum fluoride creates "pillars," or raised areas, of aluminum fluoride which may exceed 0.004 inches. The pillars prevent the substrate from fully contacting the upper surface of the support member and interfere with chucking of the substrate by causing backside pressure failure. Accordingly, the pillars cause local heat transfer anomalies affecting film uniformity. Additionally, the $NF_3$ cleaning gas is drawn into contact with the substrate backside and into the vacuum channels which result in contamination of the substrate and chamber components.

One attempt to mitigate or eliminate the detrimental effects of build-up on the substrate support surface is disclosed in co-pending Application No. 08/893,858, entitled "Improved Substrate Support Member" which is incorporated herein by reference in its entirety. A "sculptured" upper surface of a substrate support member is shown having recessed areas for maintaining a vacuum condition therein. The recessed areas are defined by gradually sloping surfaces formed on the upper surface of the support member and extending from a raised portion to a depressed portion thereof. The sloping surfaces are tapered at the transitions between the raised portions and the depressed portions to eliminate sharp corners. Protrusions having rounded surfaces are disposed in the recesses and cooperate to provide a support surface for substrates. The vacuum condition is established by coupling the recessed areas to a vacuum supply via holes formed in the support member and terminating at the recessed areas. Thus, the problems associated with cleaning gases are overcome by eliminating intersecting grooves and by rounding the corners of the protrusions.

However, while the prior art support members achieved good deposition uniformity for 200 mm substrates, larger substrate sizes required support member design alterations. In particular, the scale-up to larger substrates, such as 300 mm, required increasing the length of the heating element which had typically been a single turn coil for 200 mm substrate support members. The increased density of the heating coil leads to undesirable localized heating patterns resulting in "fingerprinting" on the substrates. Fingerprinting, in turn, leads to non-uniform deposition of material on the substrate.

Further, as the overall density of vacuum channels, purge gas channels, heating coils, etc., increases, cross-talk between these various features formed in the support member also increases. Thus, for example, the vacuum channels and the gas channels communicate with one another, thereby compromising the operability of the support member and resulting in defective substrates.

Additionally, purge gas delivered through gas channels 20 such as the ones shown in FIG. 1, often experience different effective pressures at various locations depending on which channel the gas traveled along. This pressure differential causes local "bursts" of gas at the substrate edge resulting in non-uniformity of the deposited film.

Therefore, there is a need to provide a support member that eliminates the problems associated with current support members and also provides for chucking of the substrate to the support member, uniform heating of the substrate, uniform gas delivery, and the elimination of ridges of aluminum fluoride and other undesirable contaminants. Preferably the support member may be utilized for various sized substrates, such as 200 mm and 300 mm substrates, and can be scaled to other size substrates as well.

SUMMARY OF THE INVENTION

The present invention generally provides a support member adapted to provide vacuum chucking and uniform purge gas delivery. More particularly, the present invention provides a support member comprising an upper surface having one or more recessed areas to support a vacuum condition and raised areas to support a substrate. The recessed areas are in fluid communication with a vacuum channel formed in the support member. Vacuum ports formed in the recessed areas communicate with the vacuum channel. A portion of the vacuum ports are coupled to the vacuum channel via bypass channels. The bypass channels extend around other features formed in the support member, such as gas channels.

In another aspect of the invention, the support member comprises a purge gas delivery passageway disposed substantially radially outwardly of and around a vacuum channel. The gas passageway comprises two or more annular channels, concentrically disposed about the vacuum channel, and coupled to one another by connecting channels. Vacuum ports disposed on the upper substrate support surface of the support member are in fluid communication with the vacuum channel. An outer portion of the vacuum ports is located diametrically exterior to at least one of the two or more annular channels. Bypass channels formed in the support member couple the outer portion of the vacuum ports to the vacuum channel.

In still another aspect of the invention, the support member comprises two portions, an upper portion and a lower portion. A vacuum channel and a concentrically disposed gas channel are formed in the upper portion. The gas channel comprises two or more annular channels disposed about the vacuum channel coupled to one another by connecting channels. Vacuum ports disposed on the upper substrate support surface of the support member are in fluid communication with the vacuum channel and sustain a vacuum condition on the substrate support surface. An outer portion of the vacuum ports is located diametrically exterior to at least one of the two or more annular channels. The outer portion of vacuum ports is coupled to the vacuum channel by bypass channels formed in the support member. The lower portion of the support member also preferably includes a heating element embedded therein.

In yet another aspect of the invention, the support member comprises an upper substrate support surface having isolated vacuum recessed areas disposed thereon. The recessed areas are coupled to a vacuum supply. A heating element is disposed in the support member below the recessed areas. The heating element forms multiple arcs below and adjacent to the recessed areas to allow for thermal communication therewith. Preferably, the support member comprises two portions in mating abutment wherein the upper substrate support surface is disposed on a first portion and the heating element is disposed in a second portion.

Another aspect of the invention is a process chamber having a support member disposed therein. The support member includes an upper substrate support surface and is mounted to a shaft, the support member and shaft assembly being vertically movable in the process chamber. The support member preferably comprises two portions, an upper portion and a lower portion, wherein the upper substrate support surface is disposed on the upper portion and the shaft is mounted to the lower portion. A vacuum channel and a concentrically disposed gas channel are formed in the upper portion. The gas channel comprises two or more annular channels disposed about the vacuum channel coupled to one another by connecting channels. Vacuum ports disposed on the upper substrate support surface are in fluid communication with the vacuum channel and sustain a vacuum condition on the substrate support surface. An outer portion of the vacuum ports is located diametrically exterior to at least one of the two or more annular channels. The outer portion of vacuum ports is coupled to the vacuum channel by bypass channels formed in the support member. The lower portion of the support member also preferably includes a heating element embedded therein.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3 is a top view of the support member showing the improved upper surface design of the present invention.

FIG. 4 is a side cross sectional view taken along lines 4—4 in FIG. 3 showing the rounded vacuum port.

FIG. 5 is a side cross sectional view taken along lines 5—5 in FIG. 3 showing the gradual transition between the rim and a recessed area.

FIG. 6 is a side cross sectional view taken along lines 6—6 in FIG. 3 showing the gradual transition between the intermediate raised portion and the recessed areas.

DETAILED DESCRIPTION OF THE PREFERRED EMBODIMENT

The present invention generally provides an improved support member comprising two disk-shaped portions secured to one another. A first portion includes a vacuum channel and a purge gas delivery passageway disposed along a common plane. The purge gas delivery passageway includes one or more annular gas channels concentrically disposed about the vacuum channel. The vacuum channel and the one or more concentric annular gas channels communicate with the upper surface of the support member through passages formed in the support member. The upper surface comprises various raised portions extending about its periphery and various protrusions that define a raised substrate support surface and one or more isolated recessed areas. The recessed areas are in flow communication with the vacuum channel via a plurality of vacuum ports. An outer portion of the vacuum ports is disposed radially outwardly of one or more of the annular gas channels. Bypass channels formed in the support member provide fluid communication between the vacuum channel and the outer portion of the vacuum ports. The bypass channels are coupled at one end to the vacuum channel and extend around a portion of the annular gas channels. A vacuum supply is coupled to the vacuum channel so that, when a substrate is placed on the support surface, the recessed areas and the vacuum supply provide a vacuum chuck, adhering the substrate to the support member. A gas supply delivers a purge gas to the concentric annular gas channels and through a plurality of holes and conduits disposed at the perimeter of the support member. A second portion of the support member includes a heating element embedded therein. The heating element is in thermal communication with the first portion and in particular with the upper surface to provide heat thereto.

For clarity and ease of description, the following description refers primarily to a CVD process chamber and system, although the present invention is equally applicable to other types of processing systems that utilize vacuum chucks and systems.

Figure 2:
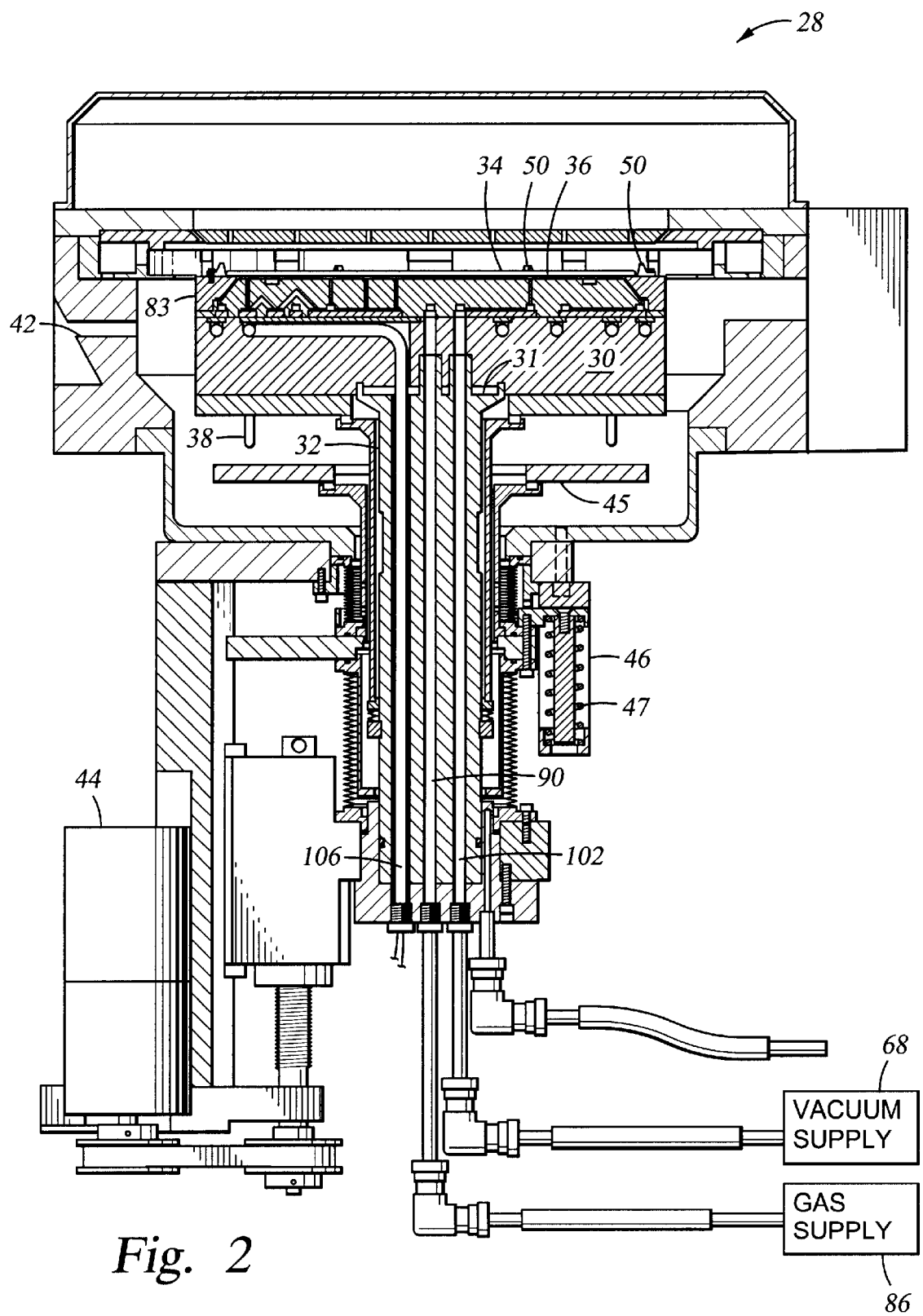
FIG. 2 is a side cross sectional view of the process chamber containing the support member.

FIG. 2 shows a typical process chamber 28 incorporating the invention. The chamber 28 may be part of a vacuum processing system having a plurality of process chambers connected to a central transfer chamber. The process chamber 28 houses a support member 30, such as a pedestal or susceptor, mounted on a generally vertically oriented shaft 32. Preferably, the support member is at least partially insulated from the shaft by an air-gap 31. The support member 30 supports a substrate 34 on its upper support surface 36 during processing. Typically, the support member 30 comprises a metal, e.g., aluminum, that has a single coil resistance heating element 106, discussed in detail below with reference to FIG. 9, embedded therein to provide heat to a substrate 34 supported thereon. However, the support member 30 may be formed of other materials such as ceramic or stainless steel.

A motion actuating assembly 44 connected to the support member 30 moves the support member 30 vertically within the process chamber 28 alternately between a first, lowered position, and a second, raised position, where the process step is performed. Removal of the substrate 34 is achieved by a conventional robot arm (not shown) which enters the process chamber 28 through the slit valve opening 42. The same robot arm is also used to insert the substrate 34 into the process chamber 28.

FIG. 2 also illustrates substrate lift pins 38 disposed through the body of the support member 30. Typically, the support member 30 includes three such lift pins 38 to lift the substrate 34 clear of the upper surface 36 of the support member 30 after processing. The lift pins 38 are movable vertically under action of a motion actuating assembly 44 and, in part, by a biasing assembly 46 and an elevator plate 45. FIG. 2 shows the support member 30 and the elevator plate 45 in a raised position wherein a spring 47 of the biasing assembly 46 is fully extended.

In operation, the substrate 34 is placed onto the upper surface 36 of the support member 30 as follows. Initially, the support member 30 is moved to the first, lowered, position wherein the lift pins 38 are urged into an extended position by the elevator plate 45. In the lowered position, the elevator plate 45 is disposed against the lower face of the support member 30 and the spring 47 is fully compressed. The robot arm (not shown) then inserts the substrate 34 into the process chamber 28 through the slit valve opening 42 supporting the substrate 34 vertically above the support member 30. The motion actuating assembly 44 then raises the support member 30 a distance sufficient to bring the lift pins 38 into contact with the substrate 34 and lift the substrate 34 from the robot arm to a position intermediate the first and second positions of the support member 30. The robot arm is retracted from the process chamber 28. Next, the motion actuating assembly 44 lifts the support member 30 from the intermediate position to the second position causing the spring 47 to be fully extended. Upon full extension of the spring 47 the elevator plate 45 comes to rest. During the continuing upward motion of the support member 30, the lift pins 38 are retracted below the upper surface 36 of the support member 30 thereby positioning the substrate 34 on the upper surface 36. Guide pins 50 disposed intermittently about the perimeter of the support member 30 urge the substrate into a central position relative to the upper surface 36. Performing these steps in reverse order operates to complete a transfer of the substrate 34 from the support member 30 to the robot arm and out of the process chamber 28.

To facilitate heat transfer between the support member 30 and the substrate 34, the substrate 34 is preferably chucked, or adhered, to the upper surface 36 of the support member 30. To provide the chucking, a pressure differential is created between the substrate 34 and the support member 30 in excess of the vacuum condition maintained in the chamber 28. That is, when the substrate 34 is chucked to the support member 30, the pressure between the substrate 34 and the support member 30 is less than the pressure in the process chamber 28. To create this pressure differential, the upper surface 36 is in fluid communication with a vacuum supply 68.

Note that the support member 30 has a diameter that is slightly larger than the diameter of the substrate 34 to allow, for example, attachment of the guide pins 50 thereto. However, as used herein, upper surface 36 refers to the area of the support member 30 adapted to support the substrate 34 thereon.

FIG. 3 shows a top view of a support member 30 of the invention. Generally, to accomplish the distribution of the vacuum, the upper surface 36 includes raised areas adapted to support a substrate thereon and recessed areas adapted to support a low pressure region via fluid communication with the vacuum supply 68. The upper surface 36 has an annular outer raised portion 52 disposed about its periphery forming a continuous annular ring having an outer diameter approximately equal to the outer diameter of the substrate 34 and an inner diameter that is slightly less than the outer diameter of the substrate 34. Two additional concentric raised areas, an intermediate raised portion 56 and a central raised portion 58, are disposed in spaced relationship to one another and to the outer raised portion 52. As shown in FIG. 3, the lift pins 38 are disposed through the intermediate raised portion 56.

The raised portions cooperate to define two recessed areas. A first recessed area 60 is disposed between the central raised portion 58 and the intermediate raised portion 56 while a second recessed area 62 is disposed between the outer raised portion 52 and the intermediate raised portion 56. Thus, a substrate placed upon the upper surface 36 rests upon the raised portions 56, 58 and outer raised portion 52 and is maintained in spaced relation above the recessed areas 60, 62. Because the outer raised portion 52 and raised portions 56, 58 are continuous annular rings, they define isolated cavities which are enclosed by a substrate to effectively seal the cavities from the processing environment of process chamber 28 (shown in FIG. 2). Thus, when a vacuum is applied to the cavities, the support member 30 is capable of maintaining a pressure in the cavities that is lower than the pressure in the process chamber 28.

The vacuum condition in the recessed areas 60, 62 is generated through a plurality of inner vacuum ports 66 and outer vacuum ports 67 vertically formed in the support member 30 and terminating at the upper surface 36. The outer vacuum ports 67 are disposed in the second recessed area 62 while the inner vacuum ports 66 are disposed in the first recessed area 60 as well as the central raised portion 58. Because the recessed areas 60, 62 are isolated regions, vacuum ports 66, 67 are provided in both recessed areas 60, 62.

In the preferred embodiment, the recessed areas 60, 62 are recessed below the respective raised portions 56, 58 by about 0.001 to about 0.005 inches. Most preferably, for a support member 30 sized to accommodate 300 mm substrates, the first recessed area 60 is about 0.0015 inches deep and the second recessed area 62 is about 0.005 inches deep. Note that the amount of recess of the present invention is preferably much less than the groove depth of about 0.015 to about 0.025 inches of prior art support members such as the one shown in FIG. 1. Because of the close proximity of the substrate 34 to the upper surface 36, even over the recessed areas 60, 62, the support member 30 is able to uniformly heat the lower surface area of the substrate 34. The thermal conductance from the support member 30 to a substrate may be adjusted by varying the depth of the recessed areas 60, 62. In general, the shallower the recesses the higher the thermal conductance, while the deeper the recesses the lower the thermal conductance. However, the temperature profile is dependent upon other design factors such as the positioning of the heating element 106 which is described in greater detail below with reference to FIG. 9.

Figure 1:
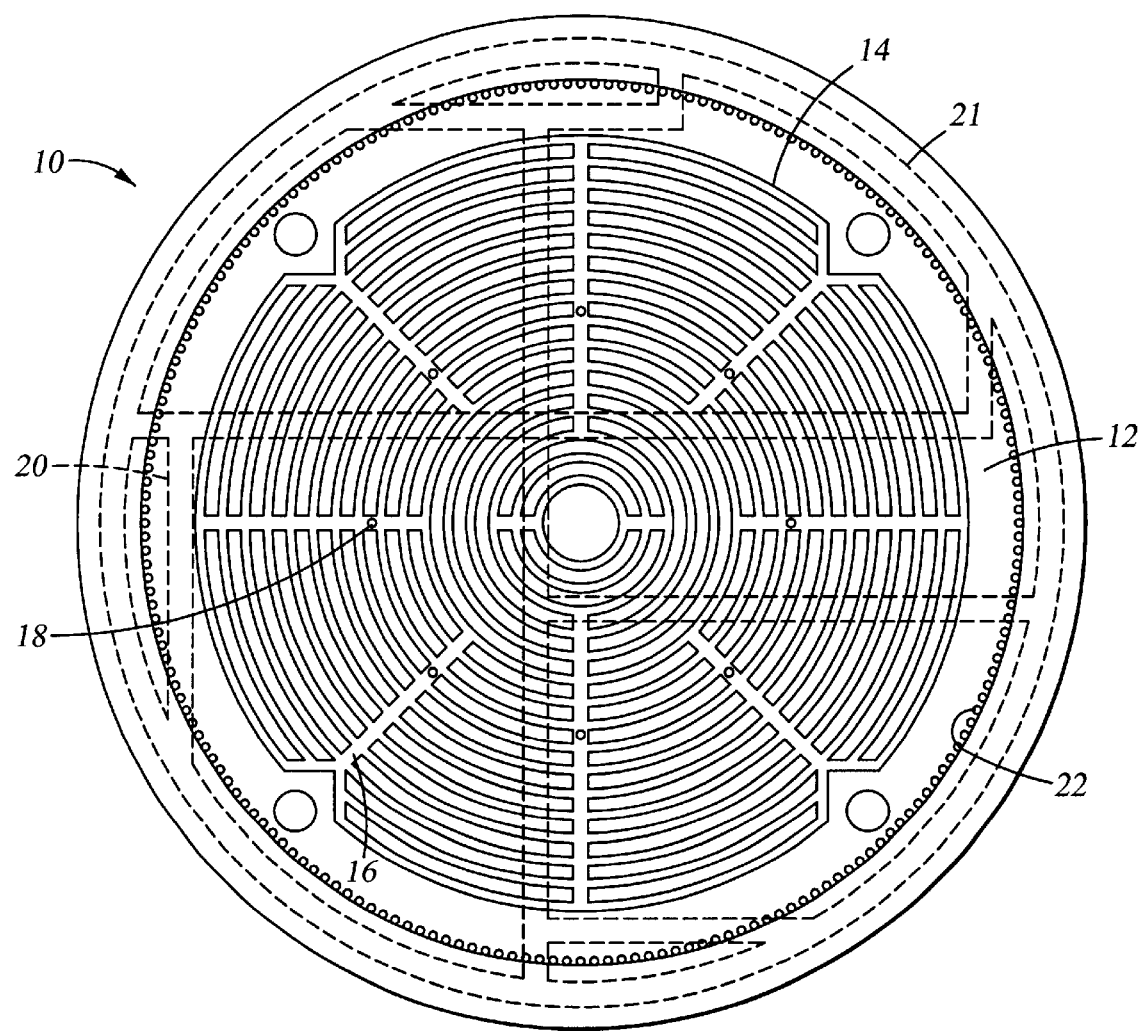
FIG. 1 is a top view of a prior art support member showing the grooves and purge gas channels formed therein.

As mentioned, one problem associated with the prior art support members, such as the one shown in FIG. 1, is that they tend to form ridges of material at the intersection of the grooves and the holes with the upper surface where sharp edges and rapid changes in the height of the upper surface are formed. The present invention overcomes this problem by eliminating the sharp edges and rapid changes in the height of the upper surface 36 by providing a gradual transition from the raised portions to the recessed portions. FIGS. 4 through 6 show the gradual transitions which provide a smooth slope from one height to the other.

FIG. 4 is a partial cross sectional view of an inner vacuum port 66. As shown, the present invention eliminates the sharp edges at the interface by rounding the edges 65. Other features of the support member shown in FIG. 3, such as the outer vacuum ports 67 and the apertures through which the lift pins 38 are disposed, may be similarly constructed.

FIG. 5 shows a partial cross sectional view of the transition of the upper surface 36 from the outer raised portion 52 to the second recessed area 62 taken along line 5—5 of FIG. 3. FIG. 6 shows a cross sectional view of the intermediate raised portion 56 taken along line 6—6 showing the transition of the first and second recesses 60, 62. The present invention utilizes a gradual taper, or slope, having a rise-to-run ratio (i.e., the change in the vertical distance for a given lateral distance) of about 1 to 50. The sharp transition between the raised portions 52, 56, 58 and the recessed areas 60, 62 is thereby eliminated.

Figure 7:
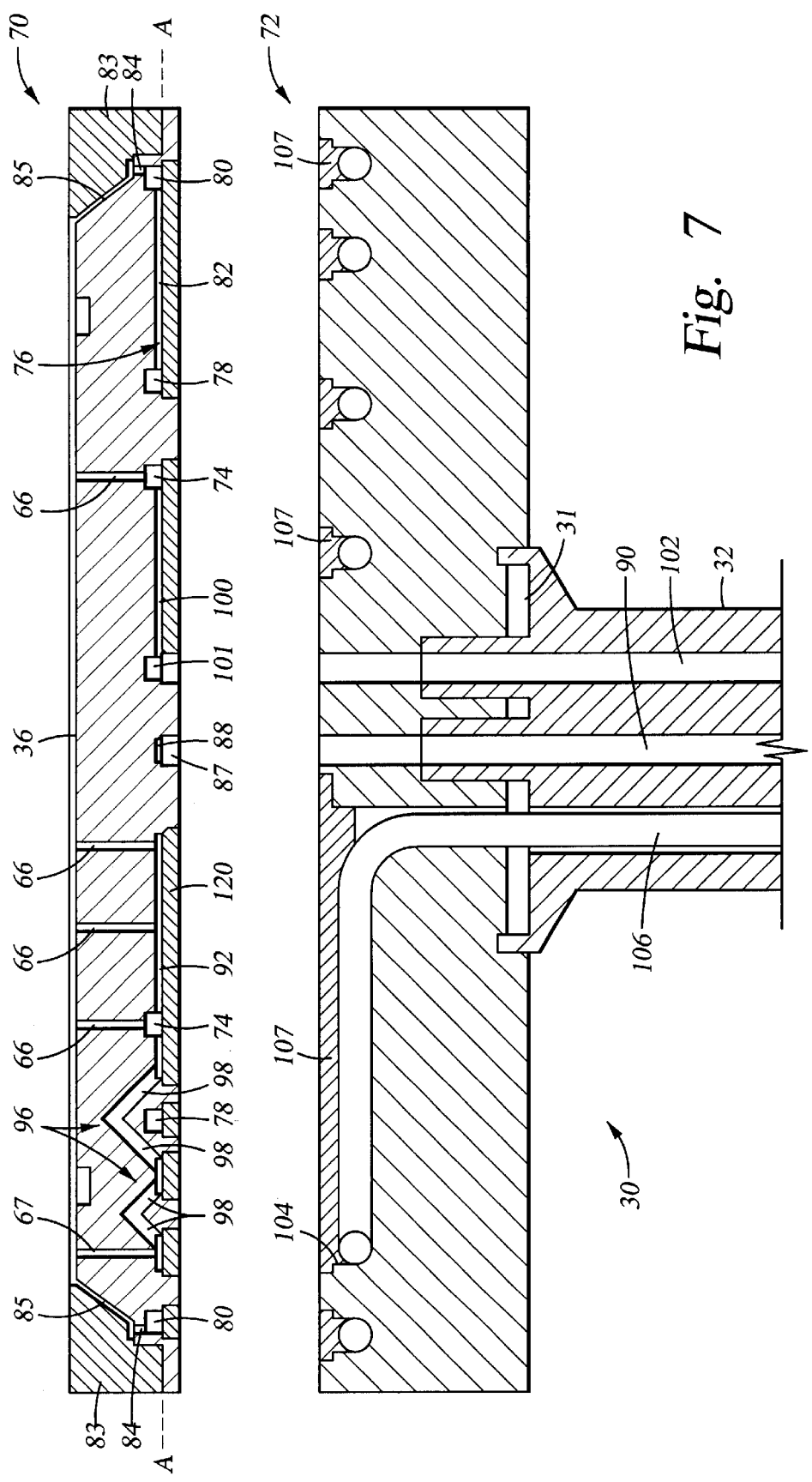
FIG. 7 is a partially exploded cross sectional view of the support member taken along lines 7—7 of FIG. 8.

Referring now to FIG. 7, a partially exploded cross section of the support member 30 is shown. The support member 30 comprises two portions, an upper portion 70 and a lower portion 72. As will be described, the portions 70, 72 facilitate the construction of various features therein. Once the features have been formed in their respective portions, the upper and lower portions 70, 72 are secured together by brazing or other adhesion methods such as welding, fusion, electron beam welding, etc. The integrated support member 30 is then mounted to the shaft 32 which supports various pipes extending into the support member 30.

Figure 8:
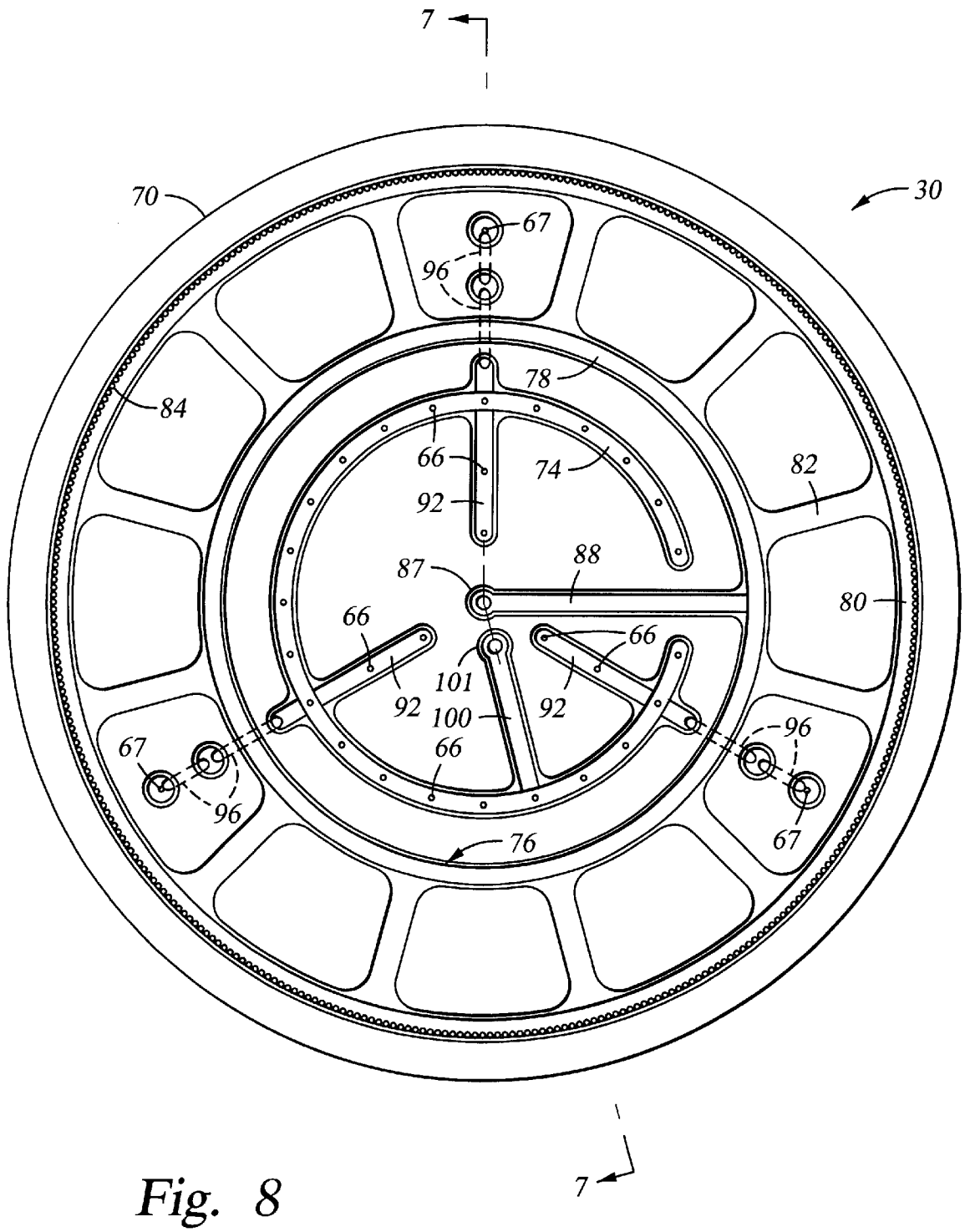
FIG. 8 is a bottom view of the top portion of the support member.

The top portion will now be discussed in reference to FIG. 7 and FIG. 8. It is understood that FIG. 7 is taken along section lines 7—7 of FIG. 8. FIG. 8 is a bottom cross sectional view of the top portion 70.

Referring primarily to FIG. 8, a vacuum channel 74 and a concentrically related gas channel 76 are shown formed in the lower face of the top portion 70. The vacuum channel 74 and the gas channel 76 are substantially coplanar along a common plane A (shown in FIG. 7). The gas channel 76 comprises an inner annular channel 78 and a concentric outer annular 80 channel connected by a plurality of interconnecting channels 82. A plurality of gas holes 84 disposed at. a perimeter of the top portion 70 provide outlets for a purge gas. In the preferred embodiment, the plurality of holes 84 comprises 360 equally spaced holes having a diameter of 0.020 inches.

Referring now to FIG. 7, the plurality of holes 84 are shown connected to the conduits 85 which are defined by the outer sloped surface of the upper portion 70 and the inner sloped surface of an edge ring 83. The edge ring 83 is preferably made of a material having the same or similar thermal coefficient of expansion as the upper portion 70. A preferred material for the upper portion 70 and the edge ring 83 is aluminum. The edge ring 83 and the outer perimeter of the upper portion 70 are angled inwardly to induce a particular directional flow to the gas flowed therethrough.

The gas channel 76 receives gas from a remote gas supply 86, shown in FIG. 2, via a gas inlet port 87, a gas inlet passageway 88 and a pipe 90. The gas supply 86, which comprises an inert gas such as argon, is coupled to the pipe 90 downstream of the support member 30. The pipe 90 extends through the length of the shaft 32 and, at an upper end, connects to the gas inlet port 87. The port 87 provides a juncture between the pipe 90 and the gas inlet passageway. As shown in FIG. 8, the gas inlet passageway 88 is radially disposed and is preferably coupled to the inner annular channel 78 at a point between two intersecting channels 82.

In operation, the gas source 86 supplies gas to the gas pipe 90. The gas is delivered to the port 87 and into inlet passageway 88 and routed to the inner annular channel 78. The inner annular channel 78 acts as a first distribution manifold for the gas ensuring uniform delivery. Positioning the gas inlet passageway 88 between intersecting channels 82, as shown in FIG. 8, causes the gas to flow circumferentially about the inner annular channel 78. The gas is then flowed through the interconnecting channels 82 into the outer annular gas channel 80 which provides a second distribution manifold. The gas is flowed through the plurality of holes 84 and through the conduits 85.

As shown in FIG. 8, the vacuum channel 74 is an open-ended circle having equally spaced bores 92 (three shown). The bores 92 are shaped as truncated spokes disposed radially towards the center of the support member 30, but terminating a short distance therefrom. A plurality of inner vacuum ports 66, previously discussed with reference to FIG. 3, extend vertically from the bores 92 through the support member 30 and terminate at the upper surface 36. In the preferred embodiment, two vacuum ports 66 having diameters of 0.052 inches, extend from each of the bores 92. Referring briefly again to FIG. 3, it can be seen that the two inner vacuum ports 66 extending from the bores 92 are disposed on the central raised portion 58 while the remaining inner vacuum ports 66 communicate with the first recessed area 60.

As noted previously, each of the isolated recessed areas 60, 62 require at least one vacuum port so that a vacuum condition may be maintained in the recesses 60, 62. Thus, FIGS. 3, 7 and 8 show additional outer vacuum ports 67 (three shown in FIG. 3 and FIG. 8) at an outer diameter of the support member 30. The outer vacuum ports 67 are at a diameter substantially equal with the second recessed area 62 and are disposed between the inner annular gas channel 78, the outer annular gas channel 80, and the interconnecting channels 82. The outer vacuum ports 67 extend through the support member 30 to the upper surface 36, and in particular, to the second recessed area 62.

In order to couple the outer vacuum ports 67 with the vacuum channel 74, a bypass channel 96 is formed in the support member 30 as shown in FIG. 7. FIG. 7 shows a side view of the bypass channels 96. The bypass channels 96 comprise a pair of segments 98 which intersect one another at a point outside of plane A above the inner annular gas channel 78. The segments 98 are preferably drilled holes each having a 0.125 diameter. The segments 98 are drilled at an angle, for example 50°, relative to plane A for an upper portion having a thickness of approximately 1.00 inch. Thus, the bypass channels 96 provide a bridge, or cross-over, to couple the otherwise isolated second recessed area 62 to the vacuum channel 74 via vacuum ports 67.

Returning now to FIG. 7 and FIG. 8 simultaneously, the vacuum channel 74 is shown coupled to a vacuum inlet passageway 100. The vacuum inlet passageway 100 extends radially from a central vacuum port 101 to intersect the vacuum channel 74 between two of the bores 92. The vacuum port 101 is a juncture between the vacuum inlet passageway 100 and the upper end of a vacuum pipe 102 extending through the shaft 32 of the support member 30. The pipe 102 may be a bore drilled through the shaft 32 or a length of tubing disposed in the shaft 32. The lower end of the pipe 102 is coupled to the vacuum supply 68 which is positioned external to the process chamber 28. Thus, a vacuum is communicated from the vacuum supply 68 through the vacuum pipe 102 to the bores 92 which in turn communicate the vacuum to the upper surface 36 through the vacuum ports 66, 67.

Figure 9:
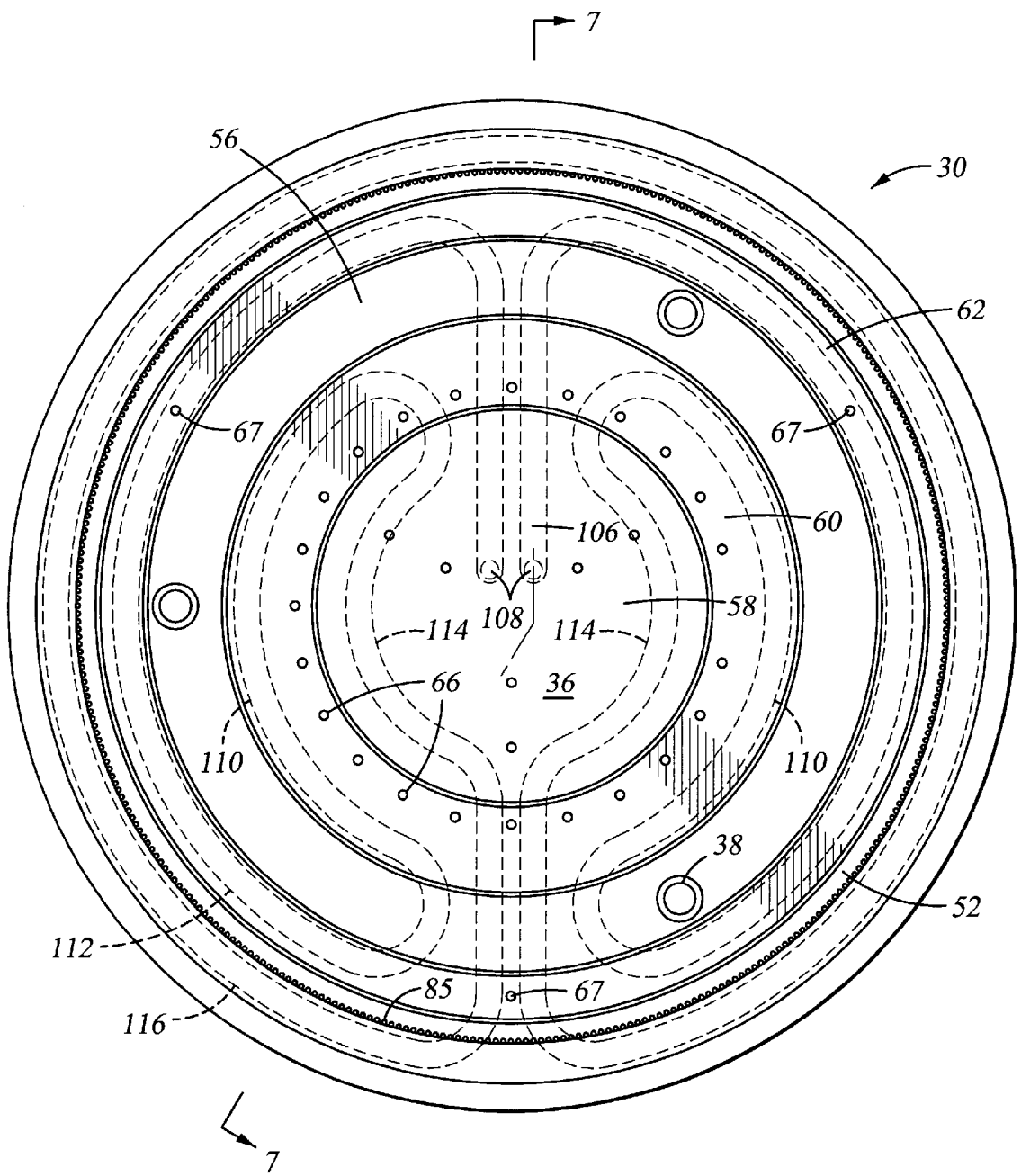
FIG. 9 is a top view of the support member showing the heating coil in hidden lines.

Referring to FIGS. 7 and 9, the lower portion 72 will now be discussed. In general, the lower portion 72 comprises a labyrinthine groove 104 having a heating element 106 disposed therein. Preferably, the heating element 106 is a multi-loop heating coil made of a conventional material such as nichrome wire surrounded with an MgO insulation within a metal sheath. The metal sheath may be made of Incoloy™, Inconel™, stainless steel, or other metal capable of withstanding the high temperatures reached during casting/welding. Electrodes 108 at each end of the heating element 106 are coupled to a power supply (not shown).

In order to provide uniform heating of the support member 30 and to uniformly heat a substrate, the heating element 106 is preferably in contact with the bulk of the support member 30 on all sides. One or more sealing members 107 are disposed over the heating element 106 and preferably contact the upper portion 70 when the portions 70 and 72 are secured to one another. The sealing members 107 are preferably made of a material having good thermal conductive properties such as a metal. The sealing members 107 are partially molded around the outer surface of the heating element 106 to minimize the formation of air pockets in the groove 104 and provide a thermal conducting medium between the heating element 106 and the upper portion 70. Air pockets act as thermal insulators inhibiting the desired thermal conductance between the heating element 106 and the upper portion 70.

The heating element 106 is adapted to provide sufficient heat to maintain the upper surface 36 of the support member 30 at an elevated process temperature, typically between about 250° C. and about 500° C. where the support member is made of aluminum. The heating element 106 is preferably disposed at least partially below and adjacent the first and second recessed areas 60, 62, the central raised portion 58, and the outer raised portion 52. The positioning of the heating element 106 in these areas of the support member provides a uniform thermal profile across the upper surface 36.

As shown in FIG. 9, the heating element 106 forms a curvilinear path about the center of the support member 30 positioned to avoid interfering with the lift pins 38 and forming three pairs of arcs and an outer concentric open-ended circle. The arcs of each pair are in a symmetrical facing relation to one another. A first pair of arcs 110 is disposed between the inner and outer diameters of the first recessed area 60, while a second pair of arcs 112 is disposed between the inner and outer diameter of the second recessed area 62. A third pair of arcs 114 is disposed radially inwardly of the outer diameter of the central raised portion 58. Note that the first and second pairs of arcs 110, 112 are disposed substantially at equal diameters with the first and second recessed areas 60, 62 respectively. Positioning the arcs 110, 112 in close proximity with the recessed area 60, 62 allows for greater thermal communication therewith as opposed to more remote features of the support member such as the intermediate raised portion 56. A portion of the heating element 106 shaped as an open-ended circle 116 is disposed at a diameter approximately equal to that of the plurality of conduits 85.

While the heating element 106 is preferably a single unit as shown in FIG. 9, another embodiment may comprise two or more separate heating elements. However, to avoid crowding the support member 30 and shaft 32 with additional electrodes and heating elements, the preferred embodiment includes one heating element.

The particular arrangement of the heating element 106 shown in FIG. 9 ensures excellent heating uniformity and, consequently, uniformity of the film deposited on the substrate. The configuration and design of the various features and components of the support member results in a particular thermal profile across a substrate. For example, because the recessed areas 60, 62 cooperate with the substrate to form cavities, heat transfer to a substrate is reduced. The present invention achieves thermal uniformity by placing the heating element 106 in closer communication with the recessed areas 60, 62 as opposed to the intermediate raised portion 56, for example, which abuts the substrate. Further, although the outer raised portion 52 and the central raised portion 58 are each in mating abutment with the substrate during operation, thereby allowing good thermal conductance therewith, both features are susceptible to heat loss resulting in thermal non-uniformity over the substrate. Specifically, the central raised portion 58 is in intimate thermal communication with the shaft 32 (shown in FIG. 7) which acts as a heat sink drawing heat away from the central raised portion 58. This effect is partially offset by the insulating air-gap 31 (shown in FIG. 7). However, positioning the third pair of arcs 114 beneath the central raised portion 58 ensures greater thermal uniformity. Similarly, the outer raised portion 52 experiences heat loss to the support member 30 environment which acts as a heat sink to the support member 30 generally. Thus, the fourth pair of arcs 116 is disposed below the outer raised portion 52 in order to maintain a uniformly elevated temperature at the outer perimeter of the support member 30.

Other methods of controlling the temperature profile across the upper surface 36, and in particular across a substrate, are possible according to the present invention. For example, and as noted previously, the thermal exchange between a substrate and the support member 30 may be altered by varying the dimensions of the recessed area 60, 62.

Referring again to FIG. 7, in general, the lower portion 72 has a diameter substantially equal to that of the upper portion 70. Thus, the portions 70, 72 cooperate to form an integrated unit once assembled. As noted above, assembly of the portions 70, 72 may be accomplished by brazing or other methods such as welding, fusion, and the like. The shaft 32 may then be mounted to the lower portion 72 by similar methods.

The features of the upper and lower portions 70, 72 are preferably formed by milling out material from the appropriate portion. Thus, the vacuum and gas channels 74, 76 formed in the upper portion 72 are patterned by milling material from the lower face of the upper potion 70. The vacuum ports 66, 67 and bypass channels 96 are then drilled at the appropriate points into the upper portion 70. Preferably, the various features of the support member 30 are sealed by conformal sealing members 120 which may be secured by welding or adhesion methods. The sealing members 120 preferably comprise the same material as the support member 30 in order to avoid local heating differentials. The sealing elements 120 provide higher integrity of the vacuum and gas channels 74, 76 and prevent cross-talk therebetween. Further, the channels are kept free of debris which may contaminate the channels during brazing of the upper and lower portions 70, 72.

For a specific embodiment, it is understood that where the features in either the upper portion 70 or lower portion 72 are sealed by welding, the features in the other portion need not be sealed. In such an embodiment, the features are isolated from one another by tightly brazing the portions together. For example, where the heating element 106 is embedded in the lower portion 72 and sealed by welding as described above, the upper surface of the lower portion 72 provides a conformal sealing surface for the vacuum and gas channels 74, 76. If necessary the upper surface of the lower portion 72 may be planarized to ensure uniform contact between the portions 70, 72. The lower portion 72 and upper portion 70 are then aligned and placed in mating abutment for brazing.

Figure 10:
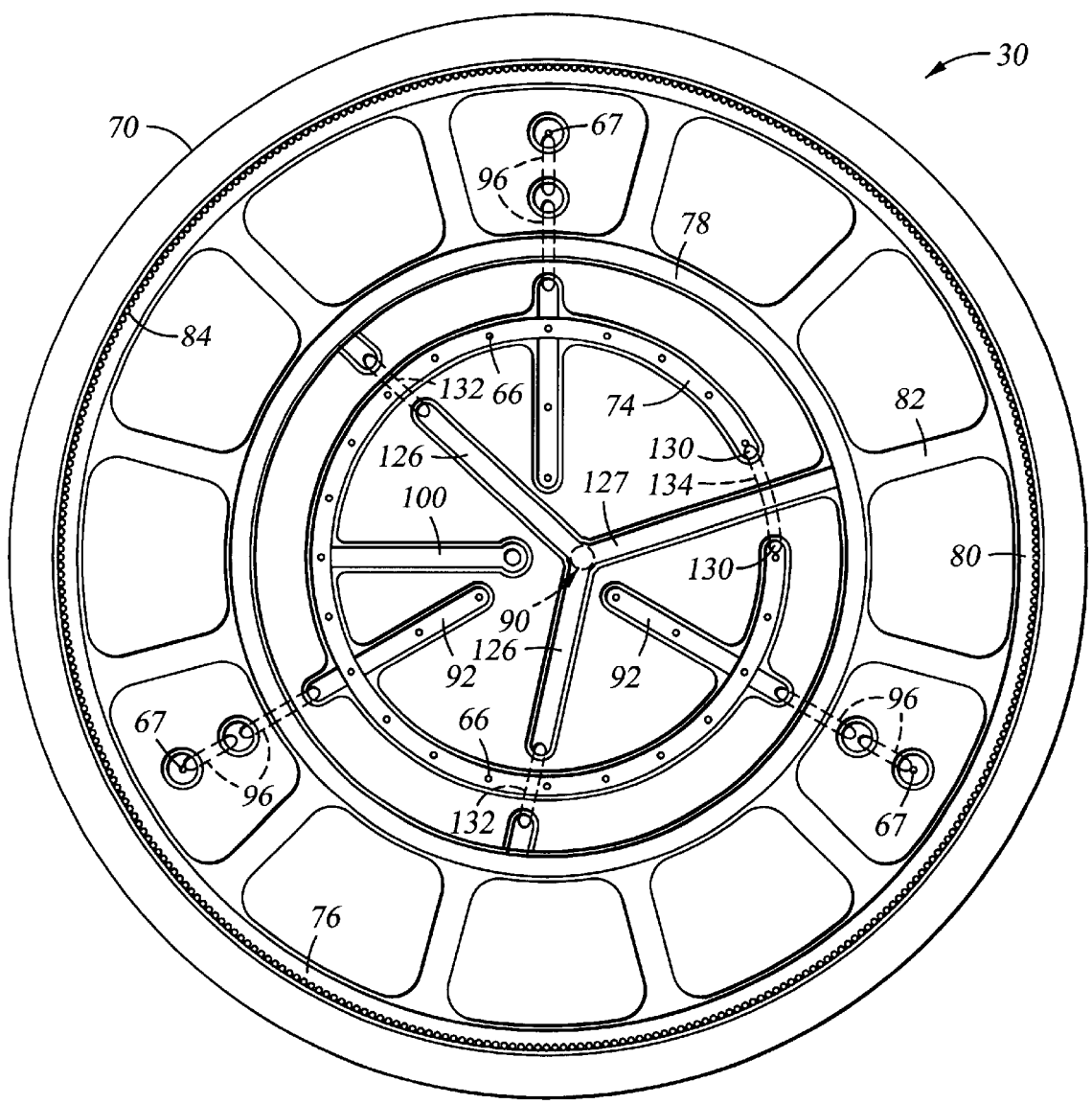
FIG. 10 is a bottom view of an alternative embodiment of the vacuum and gas channels.

The support member 30 shown in FIGS. 3–9 provides uniform heating of a substrate disposed thereon. However, FIGS. 3–9 are merely illustrative of one embodiment. Numerous variations according to the present invention are possible. For example, FIG. 10 is a bottom cross sectional view of another embodiment of the top portion 70. While the inner and outer annular gas channels 78, 80 are configured substantially similar to those shown in FIG. 8, additional gas inlet passageways 126, 127 are provided. Each of the passageways 126, 127 extend from a central manifold 128 at a juncture with the gas pipe 90. The gas inlet passageways 126, 127 (three shown) are uniformly spaced to intersect the inner annular gas channel 78 at three points. Two gas inlet passageways 126 are coupled to the inner annular gas channel 78 via bypass channels 132 (shown by hidden lines) such as the bypass channels 96 shown in FIGS. 7 and 8. A third passageway 127 is disposed through the terminal ends 130 of the open-ended vacuum channel 74 similar to the gas inlet passageway 88 in FIG. 8. However, in the embodiment shown in FIG. 10, the vacuum channel 74 comprises a closed circuit by the addition of a bypass channel 134 to bridge the terminal ends 130. Alternatively, the vacuum channel 74 may comprise a uniform closed circle without the use of a bypass channel and a bypass channel may be added to couple the third passageway 127 to the inner annular channel 78. In yet another alternative, multiple gas inlet passageways may be uninterrupted pathways without the use of bypass channels (such as the gas inlet passageway 88 shown in FIG. 8 and the gas inlet passageway 127 shown in FIG. 10) milled along a common plane and bypass channels may be disposed along the vacuum channel 74 to cross over the gas inlet passageways 126, 127. Thus, the foregoing description illustrates the substantial design versatility allowed for by the present invention.

While the foregoing is directed to the preferred embodiment of the present invention, other and further embodiments of the invention may be devised without departing from the basic scope thereof, and the scope thereof is determined by the claims which follow.

What is claimed is:

1. An apparatus comprising a vacuum chamber and support member disposed therein, the support member comprising:
   (a) a first portion comprising:
      (i) a substrate support surface disposed on a first side of the first portion, comprising one or more recesses;
      (ii) a first channel formed in the support member along a first plane substantially parallel to the substrate support surface;
      (iii) a second channel formed in the support member along the first plane and disposed radially outwardly of the first channel; and
      (iv) a bypass channel formed in the support member communicating with the first channel at a first end and having at least a portion extending outwardly from the first plane; and
   (b) a second portion disposed against the first portion.

2. The apparatus of claim 1, further comprising a heating element disposed in the second portion.

3. The apparatus of claim 1, further comprising a vacuum source coupled to the first channel and a gas source coupled to the second channel.

4. The apparatus of claim 3, wherein the second channel comprises an annular channel; and further comprising, one or more ports formed in the support member at least partially disposed diametrically exterior to the annular channel and coupled to the bypass channel.

5. A substrate support member, comprising:
   (a) a substrate support surface disposed on one side of the substrate support member comprising one or more recesses;
   (b) a vacuum channel formed in the support member along a first plane and coupled to the one or more recesses;
   (c) a gas channel formed in the support member along the first plane and encompassing the vacuum channel;
   (d) a plurality of gas conduits formed at an outer diameter of the support member and in fluid communication with the gas channel; and
   (e) a plurality of bypass channels formed in the support member in fluid communication with the vacuum channel and extending from the first plane to bypass a portion of the gas channel;
   (f) a vacuum source coupled to the vacuum channel; and
   (g) a gas source coupled to the gas channel.

6. The apparatus of claim 5, further comprising one or more vacuum ports formed in the support member coupled at a first end to the vacuum channel and at a second end to the substrate support surface.

7. The apparatus of claim 5, further comprising one or more vacuum ports formed in the support member each coupled at a first end to one or more of the plurality of bypass channels and at a second end to the one or more recesses.

8. The apparatus of claim 5, wherein each of the plurality of bypass channels comprise a first segment extending from the first plane diametrically interior of the gas channel and a second segment extending from the first plane diametrically exterior of the gas channel and intersecting the first segment; wherein the second segment couples the vacuum channel to at least one of the plurality of vacuum ports.

9. The apparatus of claim 5, wherein the support member comprises:
   (a) a first portion having the vacuum channel and gas channel formed therein; and
   (b) a second portion secured to the first portion.

10. The apparatus of claim 9, wherein the substrate support surface is disposed on the first portion.

11. The apparatus of claim 9, further comprising a heating element disposed in the second portion.

12. The apparatus of claim 9, wherein a substantial portion of the heating element is disposed below and adjacent to the one or more recesses to allow thermal communication therewith.

13. The apparatus of claim 5, wherein the gas channel comprises:
   (a) a first annular gas channel;
   (b) a second annular gas channel concentrically disposed about the first annular gas channel; and
   (c) one or more connecting channels to couple the first and second annular gas channels.

14. The apparatus of claim 13, further comprising one or more vacuum ports coupled to the plurality of bypass channels at least partially disposed between the first annular gas channel and the second annular gas channel.

15. A substrate support member, comprising:
   a vacuum channel;
   a gas channel peripherally disposed around the vacuum channel, wherein the gas channel is on substantially the same plane as the vacuum channel; and
   an upper surface defining:
      a plurality of recessed areas adapted to support a low pressure region, wherein at least one of the recessed areas is disposed directly above at least a portion of the gas channel;
      a plurality of raised areas adapted to support a substrate, wherein the plurality of raised areas gradually transition toward the plurality of recessed areas; and
      a plurality of rounded orifices disposed on the at least one of the recessed areas, wherein the rounded orifices are configured for transferring vacuum from the vacuum channel to the at least one of the recessed areas.

16. The substrate support member of claim 15, further comprising one or more bypass channels connecting the rounded orifices to the vacuum channel.

17. The substrate support member of claim 15, further comprising one or more bypass channels connecting the rounded orifices to the vacuum channel through one or more vacuum ports.

18. The substrate support member of claim 15, further comprising one or more bypass channels connecting the rounded orifices to the vacuum channel, wherein a portion of the bypass channels extends above a portion of the gas channel to bypass the portion of the gas channel.

19. The substrate support member of claim 15, wherein at least one of the raised areas defines a transition surface that extends to the recessed areas, and wherein the slope of the transition surface has a rise to run ratio of less than 1.

20. The substrate support member of claim 15, further comprising one or more bypass channels connecting the rounded orifices to the vacuum channel; and wherein at least one of the raised areas defines a transition surface that extends to the recessed areas, and wherein the slope of the transition surface has a rise to run ratio of less than 1.

21. The substrate support member of claim 15, wherein an area of the upper surface surrounding each of the rounded orifices tapers downward into the each of the rounded orifices.

22. The substrate support member of claim 15, further comprising one or more bypass channels connecting the rounded orifices to the vacuum channel; and wherein an area of the upper surface surrounding each of the rounded orifices tapers downward into the each of the rounded orifices.

23. The substrate support member of claim 15, further comprising one or more bypass channels connecting the rounded orifices to the vacuum channel; wherein at least one of the raised areas defines a transition surface that extends to the recessed areas, and wherein the slope of the transition surface has a rise to run ratio of less than 1; and wherein an area of the upper surface surrounding each of the rounded orifices tapers downward into the each of the rounded orifices.

24. The substrate support member of claim 15, wherein the raised areas are concentrically disposed in spaced relationship to one another.

25. The substrate support member of claim 15, further comprising one or more bypass channels connecting the rounded orifices to the vacuum channel; wherein an area of the upper surface surrounding each of the rounded orifices tapers downward into the each of the rounded orifices; and wherein the raised areas are concentrically disposed in spaced relationship to one another.

26. The substrate support member of claim 15, wherein the recessed areas are concentrically disposed in between the raised areas.

27. A substrate support member, comprising:

a vacuum channel;

a gas channel peripherally disposed around the vacuum channel, wherein the gas channel is on substantially the same plane as the vacuum channel;

an upper surface defining:
　a plurality of recessed areas adapted to support a low pressure region, wherein at least one of the recessed areas is disposed directly above at least a portion of the gas channel;
　a plurality of raised areas adapted to support a substrate, wherein the plurality of raised areas gradually transition toward the plurality of recessed areas; and
　a plurality of rounded orifices disposed on the at least one of the recessed areas, wherein the rounded orifices are configured for transferring vacuum from the vacuum channel to the at least one of the recessed areas; and one or more bypass channels connecting the rounded orifices to the vacuum channel, wherein a portion of the bypass channels extends above a portion of the gas channel to bypass the portion of the gas channel.

28. A substrate support member, comprising:

a vacuum channel;

a gas channel peripherally disposed around the vacuum channel, wherein the gas channel is on substantially the same plane as the vacuum channel;

an upper surface defining:
　a plurality of recessed areas adapted to support a low pressure region, wherein at least one of the recessed areas is disposed directly above at least a portion of the gas channel;
　a plurality of raised areas adapted to support a substrate, wherein the plurality of raised areas gradually transition toward the plurality of recessed areas; and
　a plurality of rounded orifices disposed on the at least one of the recessed areas, wherein the rounded orifices are configured for transferring vacuum from the vacuum channel to the at least one of the recessed areas, wherein an area of the upper surface surrounding each of the rounded orifices tapers downward into the each of the rounded orifices; and one or more bypass channels connecting the rounded orifices to the vacuum channel, wherein a portion of the bypass channels extends above a portion of the gas channel to bypass the portion of the gas channel.

* * * * *

UNITED STATES PATENT AND TRADEMARK OFFICE
CERTIFICATE OF CORRECTION

PATENT NO.    : 6,464,795 B1
DATED         : October 15, 2002
INVENTOR(S)   : Semyon Sherstinsky et al.

It is certified that error appears in the above-identified patent and that said Letters Patent is hereby corrected as shown below:

Column 2,
Line 50, please change "comers" to -- corners --.

Column 3,
Lines 9 and 16, please change "comers" to -- corners --.

Column 12,
Line 10, please change "potion" to -- portion --.

Column 16,
Line 41, please change "channels" to -- channel --.

Signed and Sealed this

Fourth Day of March, 2003

JAMES E. ROGAN
*Director of the United States Patent and Trademark Office*